HEAT DISSIPATOR

Filed Dec. 23, 1968 2 Sheets-Sheet 1

INVENTORS
MILTON J. GRIMES &
HERBERT R. MEISEL
BY Glenn H. Bruestle
Attorney

Sept. 2, 1969 M. J. GRIMES ET AL 3,465,212

HEAT DISSIPATOR

Filed Dec. 23, 1968 2 Sheets-Sheet 2

INVENTORS
MILTON J. GRIMES &
HERBERT R. MEISEL

BY Glenn H. Bunestle
ATTORNEY

United States Patent Office 3,465,212
Patented Sept. 2, 1969

3,465,212

HEAT DISSIPATOR

Milton J. Grimes, Flemington, and Herbert R. Meisel, Springfield, N.J., assignors to RCA Corporation, a corporation of Delaware Continuation-in-part of application Ser. No. 533,174, Mar. 10, 1966. This application Dec. 23, 1968, Ser. No. 788,988

Int. Cl. H01l *1/12;* H02b *1/04*

U.S. Cl. 317—234 6 Claims

ABSTRACT OF THE DISCLOSURE

A heat dissipator is provided for a power transistor. To facilitate mounting, the dissipator and transistor are preassembled into a rigid assembly which is then mounted on a chassis. The heat dissipator is provided with integral rivets for securely mounting the transistor on the dissipator, with tabs for mounting the assembly on a chassis, and with embosses for maintaining the dissipator in spaced apart relation with the chassis to prevent excessive heating thereof.

This is a continuation-in-part of co-pending application Ser. No. 533,174 filed Mar. 10, 1966.

BACKGROUND OF THE INVENTION

This invention relates to heat dissipators for use with electronic devices such as power transistors or the like, and particularly to heat dissipator-electronic device assemblies for use with chassis such as printed circuit boards.

As known, certain chassis, such as printed circuit boards of such materials as phenolic, epoxy-glass fiber, or the like, are relatively poor conductors of heat and are inadequate to maintain power devices mounted thereon at safe operating temperatures. To cool such devices, it has been the practice in the past to mount heat dissipators on the power devices after the devices have been mounted on the chassis. Objections to this practice are that the dissipators are expensive, and upon mounting of the dissipators onto the devices, in tight fit for good heat transfer, rupture of the connections between the device and the electrical circuit on the chassis frequently occurs.

SUMMARY OF THE INVENTION

An electronic device such as a power transistor including a mounting means having an opening therethrough is utilized. Secured to the transistor is a heat dissipator having a mounting plate and an extending wing. The transistor is mounted on the plate. An eyelet formed from the material of the plate extends through the opening in the transistor mounting means and is outwardly flared or clinched to rigidly press the transistor against the plate. Also formed from the plate material is a tab for mounting the electronic device-dissipator assembly on a chassis such as a printed circuit board. Preferably, the plate has a number of embossments thereon to space the plate away from the chassis.

DESCRIPTION OF PREFERRED EMBODIMENTS OF THE INVENTION

Figure 1:
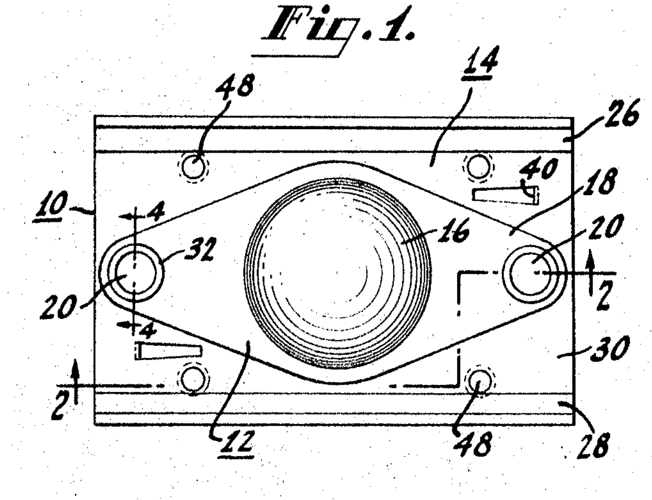
FIGURE 1 is a plan view of a transistor-heat dissipator assembly.
Figure 3:
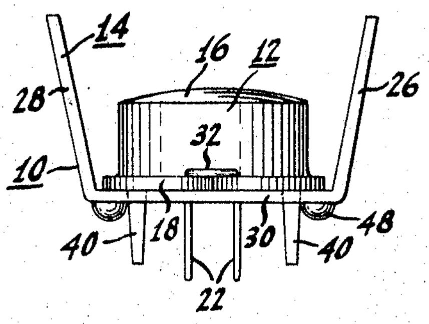
FIGURE 3 is a side elevation of the assembly shown in FIGURE 1.
Figure 2:
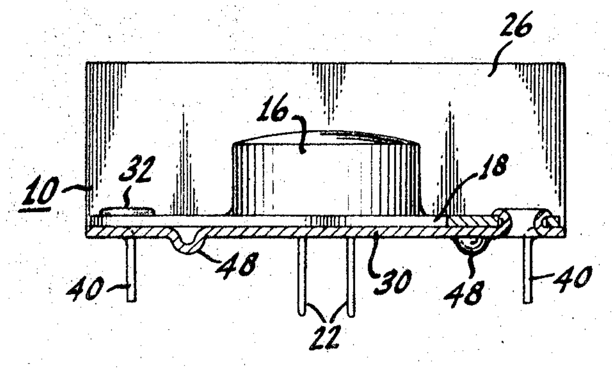
FIGURE 2 is a sectional view along line 2—2 of FIGURE 1.

With reference to FIGURES 1–3, the heat dissipator-transistor assembly 10 comprises a transistor 12 and a generally U-shaped heat dissipator 14.

In this embodiment, the transistor 12 is a known power transistor such as RCA 2N3054, and comprises an enclosure 16 sealed to an elongated flange 18 having openings 20 therethrough. The flange 18 is electrically connected to an electrode of the transistor such as the collector. Two leads 22 connected to the other electrodes of the transistor, such as the base and the emitter, extend outwardly through the flange 18.

The heat dissipator 14 comprises a pair of wings 26 and 28 joined by a plate 30. Preferably, the dissipator 14 is made of a good heat conducting material such as tin-plated steel.

Figure 4:
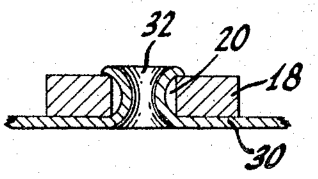
FIGURE 4 is a sectional view along line 4—4 of FIGURE 1.

For rigidly mounting the transistor 12 on the plate 30 of the disipator 14, the plate is provided with a pair of integral eyelets 32. The eyelets 32 (FIGURE 4) extend through the openings 20 in the transistor flange 18, and are outwardly flared or clinched to lock the transistor in place. The clinched eyelets 32 provide an extremely rigid mechanical connection of the flange 18 with the plate 30 thereby providing excellent heat transfer therebetween. The eyelets 32 also provide an electrical connection between the flange 18 and the dissipator 14.

For mounting the assembly 10 onto a printed circuit board, not shown, the plate 30 is provided with a pair of integral tabs 40. The tabs 40 extend through openings in the printed circuit board and are bent over to lock the assembly 10 in place. Preferably, at least one of the tabs 40 is electrically connected to the electrical circuit on the board to electrically connect the collector of the transistor 12 into the electrical circuit.

Although not necessary in all instances, since certain printed board materials are more resistant to heat than others, it is generally desirable to provide embossments 48 on the plate 30. A purpose of the embossments 48 is to space the plate 30 above the printed circuit board to prevent excessive heating of the board by the assembly 10 during operation of the transistor 12. In certain instances, such contact would cause heat blistering of the board. Also, by spacing the plate 30 above the printed circuit board, additional surface for transferring heat to ambient air is provided.

In the fabrication and use of the assembly 10, the heat dissipator 14 is first provided, as by known punching means, with the eyelets 32, the tabs 40, and the embossments 48, and then formed, using known means, into the shape shown. The transistor 12 is then rigidly mounted on the dissipator 14 by inserting the eyelets 32 through the flange openings 20 and clinching the eyelets by known means. The transistor leads 22 extend downwardly through an opening (not visible) in the plate 30 of the dissipator 14. The rigidly assembled assembly 10 is then mounted on a printed circuit board by inserting the tabs 40 through openings in the board and bending over the tabs. Electrical connections, as by soldering or the like, are made between the printed circuit and the leads 22 of the transistor and at least one of the tabs 40.

An advantage of the assembly 10 described is that by rigidly mounting the transistor 12 on the dissipator 14 prior to the mounting of the assembly 10 on a printed board, there is no danger of breaking the electrical connections between the transistor leads and the printed circuit once these connections are made. The use of eyelets 32, the tabs 40, and the embossments 48, formed from the material of the plate 30, is an extremely simple and inexpensive means for mounting the transistor 12 on the dissipator 14 and mounting the assembly 10 on a chassis.

Additionally, the use of a tab 40 for an electrode terminal of the transistor provides much greater flexibility with respect to electrically connecting the electrode into the printed circuit than was heretofore available using the flange 18 as the electrode terminal. That is, the tab may be secured to a circuit terminal by any of a number of known means such as soldering, welding, wrapping, clinching, or the like.

Figure 5:
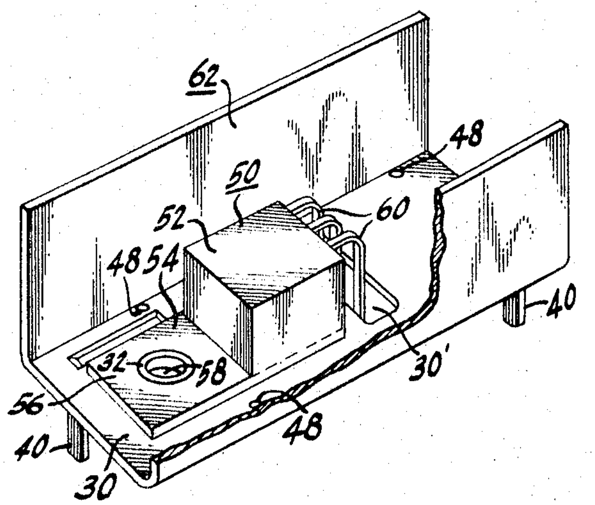
FIGURE 5 is a view in perspective, partly broken away, of another embodiment of the invention.

Another embodiment of the invention is shown in FIGURE 5. In this embodiment, the electronic device 50 is a known power transistor, such as RCA 2N5298, which comprises a plastic enclosure 52 molded onto and around the sides (but not the bottom) of a metal plate 54 having an unencapsulated laterally extending flange portion 56. The flange portion 56 has an opening 58 therethrough. The plate 54 is electrically connected to an electrode of the device 50, such as the collector electrode. Three leads 60 are connected to the other electrodes of the device, such as the base and emitter electrodes, extend outwardly and downwardly from a side of the enclosure 52.

The device 50 is mounted on a heat dissipator 62 similar to the heat dissipator 14 shown in FIGURES 1–4, the dissipator 62, however, having only a single eyelet 32. The eyelet 32 of the dissipator 62 extends through the opening 58 through the device flange 56 and is outwardly flared or clinched to lock the device in place. The leads 60 extend downwardly through an opening 30' in the plate 30. The unencapsulated bottom side of the plate 54 is pressed firmly against the heat dissipator plate 30, thereby increasing the effectiveness of the transfer of heat from the device to the dissipator in use of the device.

What is claimed is:

1. A semiconductor device assembly for mounting on a chassis comprising:

a semiconductor device having an electrode and comprising an enclosure and a flange, said enclosure being sealed to said flange, and said flange extending outwardly from a side of said enclosure and having an opening therethrough;

a heat dissipator having a plate and a heat conducting fin extending transversely of said plate;

said plate including, integral therewith, an eyelet, and a flexible tab for mounting said assembly on a chassis, said tab being electrically connected to said device electrode; and said device being disposed on said plate, and said eyelet extending through said opening in said flange and being outwardly flared for rigidly securing said device to said plate.

2. A semiconductor device assembly as in claim 1 wherein said flange extends outwardly from opposite sides of said enclosure.

3. A semiconductor device assembly as in claim 1 wherein:

said heat dissipator is generally U-shaped and has a pair of extending wings joined by said plate; and said plate has integral therewith embossments for maintaining said plate in spaced relation with said chassis.

4. A semiconductor device assembly as in claim 2 wherein:

said heat dissipator is generally U-shaped and has a pair of extending wings joined by said plate; and said plate has integral therewith embossments for maintaining said plate in spaced relation with said chassis.

5. A semiconductor device as in claims 1, 2, 3, or 4 wherein:

said plate has an opening therethrough; and terminal leads of said device extend through said flange and through said opening.

6. A semiconductor device as in claims 1 or 3 wherein:

said enclosure comprises a solid encapsulating material sealed to said flange, a surface of said flange being unencapsulated, and said surface being rigidly engaged with said dissipator plate;

said plate having an opening therethrough; and terminal leads of said device extending laterally outwardly from said enclosure and through said opening.

References Cited

UNITED STATES PATENTS

| | | | |
|---|---|---|---|
| 2,984,774 | 5/1961 | Race | 317—234 |
| 3,268,775 | 8/1966 | Brady | 317—101 |
| 3,423,516 | 1/1969 | Segerson | 317—234 |

JOHN W. HUCKERT, Primary Examiner

J. D. CRAIG, Assistant Examiner

U.S. Cl. X.R.

165—181; 317—101